(12) United States Patent
Goodrich et al.

(10) Patent No.: US 7,026,223 B2
(45) Date of Patent: Apr. 11, 2006

(54) HERMETIC ELECTRIC COMPONENT PACKAGE

(75) Inventors: Joel Lee Goodrich, Westford, MA (US); Timothy Edward Boles, Tyngsboro, MA (US)

(73) Assignee: M/A-Com, Inc, Lowell, MA (US)

( * ) Notice: Subject to any disclaimer, the term of this patent is extended or adjusted under 35 U.S.C. 154(b) by 471 days.

(21) Appl. No.: 10/109,351

(22) Filed: Mar. 28, 2002

(65) Prior Publication Data

US 2003/0183920 A1    Oct. 2, 2003

(51) Int. Cl.
*H01L 21/30* (2006.01)

(52) U.S. Cl. ............ 438/456; 438/459; 438/928; 438/977; 438/667

(58) Field of Classification Search .......... 257/704, 257/E23.187, 621, 710; 438/459, 928, 977, 438/456, 667
See application file for complete search history.

(56) References Cited

U.S. PATENT DOCUMENTS

| | | | |
|---|---|---|---|
| 3,787,252 A * | 1/1974 | Filippazzi et al. .......... 438/492 |
| 5,268,310 A | 12/1993 | Goodrich et al. .............. 437/15 |
| 5,286,926 A | 2/1994 | Kimura et al. ............... 174/250 |
| 5,311,402 A | 5/1994 | Kobayashi et al. .......... 361/760 |
| 5,343,070 A | 8/1994 | Goodrich et al. ............ 257/594 |
| 5,375,042 A | 12/1994 | Arima et al. ................ 361/784 |
| 5,475,567 A | 12/1995 | Hearn .......................... 361/778 |
| 5,696,466 A | 12/1997 | Li ................................ 330/286 |
| 5,949,654 A | 9/1999 | Fukuoka ...................... 361/760 |
| 5,998,292 A * | 12/1999 | Black et al. ................. 438/618 |
| 6,062,461 A * | 5/2000 | Sparks et al. ............. 228/123.1 |
| 6,111,199 A * | 8/2000 | Wyland et al. ............. 174/52.2 |
| 6,114,716 A | 9/2000 | Boles et al. ................. 257/207 |
| 6,150,197 A | 11/2000 | Boles et al. ................. 438/128 |
| 6,184,060 B1 * | 2/2001 | Siniaguine ................... 438/106 |
| 6,225,694 B1 | 5/2001 | Terui ............................ 257/704 |
| 6,255,899 B1 * | 7/2001 | Bertin et al. ................. 327/564 |
| 6,303,992 B1 * | 10/2001 | Van Pham et al. .......... 257/734 |
| 6,322,903 B1 * | 11/2001 | Siniaguine et al. ......... 428/617 |
| 6,346,742 B1 * | 2/2002 | Bryzek et al. ............... 257/704 |
| 6,420,209 B1 * | 7/2002 | Siniaguine ................... 438/108 |
| 6,479,320 B1 * | 11/2002 | Gooch ......................... 438/109 |
| 6,498,381 B1 * | 12/2002 | Halahan et al. ............. 257/449 |
| 6,579,804 B1 * | 6/2003 | Zhou et al. .................. 438/708 |
| 6,586,831 B1 * | 7/2003 | Gooch et al. ............... 257/704 |
| 6,639,303 B1 * | 10/2003 | Siniaguine ................... 257/621 |
| 6,664,129 B1 * | 12/2003 | Siniaguine ................... 438/107 |
| 6,740,582 B1 * | 5/2004 | Siniaguine ................... 438/637 |
| 6,794,272 B1 * | 9/2004 | Turner et al. ................ 438/459 |
| 6,878,608 B1 * | 4/2005 | Brofman et al. ............ 438/459 |

(Continued)

FOREIGN PATENT DOCUMENTS

EP    1 176 641 A2    1/2002

(Continued)

*Primary Examiner*—David E. Graybill

(57) ABSTRACT

An electric component package having a base and a lid, the base and lid defining a hermetically sealed cavity therebetween for accommodating an electric component. The base includes at least one conductive via extending therethrough, allowing control and/or input/output (I/O) ports associated with the electric component to be coupled to the conducive vias to pass signals between the sealed cavity and the exterior of the package without passing through the junction between the base and lid. The electric component package can be produced at the wafer level using conventional silicon wafer integrated circuit manufacturing machinery prior to separating the wafer into a plurality of devices.

15 Claims, 3 Drawing Sheets

U.S. PATENT DOCUMENTS

| | | | |
|---|---|---|---|
| 6,879,035 B1* | 4/2005 | Syllaios et al. | 257/704 |
| 2002/0063311 A1* | 5/2002 | Siniaguine | 257/621 |
| 2002/0084513 A1* | 7/2002 | Siniaguine | 257/621 |
| 2002/0127868 A1* | 9/2002 | Siniaguine | 438/752 |
| 2003/0085460 A1* | 5/2003 | Siniaguine | 257/698 |
| 2004/0198021 A1* | 10/2004 | Brouillette et al. | 438/459 |

FOREIGN PATENT DOCUMENTS

| | | |
|---|---|---|
| GB | 2 132 411 A | 7/1984 |
| WO | WO 9624161 A1 * | 8/1996 |
| WO | WO 9819337 A1 * | 5/1998 |
| WO | WO 01/56921 A2 | 8/2001 |

* cited by examiner (Optional)

HERMETIC ELECTRIC COMPONENT PACKAGE

FIELD OF THE INVENTION

The present invention relates to the field of electronics and, more particularly, to hermetic packages for electric components.

BACKGROUND OF THE INVENTION

Electric components are used in a wide range of applications. In many applications it is necessary to protect the electric components from the environments in which they operate. For example, electric components used in environments with high humidity need to be protected from this humidity to prevent corrosion of their electrical connections. Typically, electric components are protected by sealing them within a ceramic or semiconductor package.

FIG. 1A depicts a prior art ceramic package 102 for protecting electric components. An electric component 100 is packaged by attaching the electric component 100 to a base 104 made of a ceramic material and, then, attaching a lid 106 having a cavity 108 for accommodating the electric component 100 to the base 104 with a sealing material 110. Connections for control and input/output (I/O) signals are made to the electric component 100 from outside the package 102 through electrical leads 112 that extend along the surface of the base 104 through the sealing material 110 between the base 104 and the lid 106. Since the electrical leads 112 extend through the sealing material 110, the sealing material 110 must be non-conductive and, therefore, conventional soldering techniques cannot be used to attach the lid 106 to the base 104.

The lid 106 has a surface area that is smaller than the surface area of the base 104 to provide a suitable planar bonding area 114 on the exterior of the package 102 for facilitating contact with the electrical leads 112. Since the surface area of the lid 106 is smaller than the surface area of the base 104 (and accommodates the electric component 100), the base 104 has a relatively large footprint in relation to the electric component 100. This may be undesirable if a small form factor or a low cost is desired.

In addition, each ceramic package 102 is produced individually using expensive hybrid assembly techniques, rather than inexpensive, mass production, wafer level techniques. Also, ceramic packaging is expensive due to the high cost of raw ceramic material used to create the base 104 and lid 106. Thus, ceramic packaging may be cost prohibitive.

FIG. 1B depicts an alternative prior art ceramic package 116. In this package 116, metallic ink traces 118 are printed on a base 104 made of a ceramic material to provide connections for control and I/O signals. Ceramic side walls 120 are then added to the base 104 over the metallic ink traces 118. The electric component 100 is packaged by attaching the electric component 100 to the base 104 and, then, soldering a lid 106 made of a metallic material (or a ceramic material with a metalized seal ring) to the side walls 120. The metallic ink traces 118 have an inherent high resistivity that may make the ceramic package 116 unsuitable for certain applications. In addition, as in the previous ceramic package 102, this ceramic package 116 requires a base 104 with a relatively large footprint and uses expensive materials and hybrid assembly techniques.

FIG. 1C depicts a prior art semiconductor package 122 having a base 104 made of semiconductor material and a lid 106 made of semiconductor material. The lid 106 is attached to the base 104 using frit glass 124 (i.e., a powdered glass held together in a slurry). The electric component 100 is packaged by attaching the electric component 100 to the base 104, depositing a layer of frit glass 124 on the base 104, attaching the lid 106 to the frit glass 124, and curing the frit glass 124 to produce a sealed semiconductor package 122. Connections for control and I/O signals are made to the electric component 100 from outside the package 102 through electrical leads 112 that extend along the surface of the base 104. As in the previous techniques, the semiconductor packaging technique requires a base 104 with a relatively large footprint. In addition, the temperatures required to cure the frit glass 124 may be damaging to certain electric components.

The semiconductor package 122 may be mass produced using wafer packaging techniques. After the package 122 is produced, however, the lid 106 has to be etched precisely to expose a planar bonding area 114 without damaging the electrical leads. This additional step adds complexity, thus increasing production costs.

Accordingly, there is a need for electric component packages and a method for producing electric component packages that overcome the above limitations. The present invention fulfills this need among others.

SUMMARY OF THE INVENTION

The present invention provides an electric component package having a base and a lid that define a sealed cavity therebetween and a method for producing same. The inventive electric component package overcomes the aforementioned limitations by incorporating conductive vias that extend through a dielectric base. The conductive vias allow control and/or I/O signals associated with an electric component within the sealed cavity to enter the cavity through the base rather than the junction between the base and the lid. The electric component package provides preferably a hermetically sealed environment for the electric component that is small, inexpensive, and can be mass produced at the wafer level using conventional equipment.

One aspect of the present invention is an electric component package including a base having a first surface and a second surface opposite the first surface, the base comprising a dielectric material having at least one conductive via extending through the dielectric material between the first and second surfaces; a component located adjacent the first surface of the base, the component having at least one port coupled to the at least one conductive via; and a lid coupled to the first surface of the base, the lid and the base defining a sealed cavity therebetween, the sealed cavity sized to accommodate the component.

Another aspect of the invention is a method for sealing a component within a package. The method includes (a) forming a base having a first surface and a second surface opposite the first surface, the base comprising a dielectric material having at least one conductive via extending between the first and second surfaces; (b) establishing a component on the first surface of the base, the component having at least one port, the at least one port being coupled to the at least one conductive via; (c) forming a lid; and (d) coupling the lid to the first surface of the base, the lid and the base defining a cavity therebetween for accommodating the component.

Another aspect of the invention is a process for fabricating an electric component package having a sealed cavity for accommodating an electric component. The process includes etching a semiconductor base layer having first and second opposing surfaces to form at least one pedestal on the first surface, applying a layer of dielectric material to the first surface of the etched semiconductor base layer, grinding the dielectric layer to expose a surface of the at least one pedestal, establishing an electric component on the ground dielectric layer, the electric component having at least one port coupled to the exposed surface of the at least one pedestal, attaching a lid to the ground dielectric layer, the lid having a cavity for accommodating the electric component, and grinding the semiconductor base layer on the second surface to expose the dielectric layer, the at least one pedestal forming a conductive via extending through the dielectric layer.

Yet another aspect of the invention is a process for fabricating an electric component package having a sealed cavity for accommodating an electric component. The process includes forming a substantially dielectric base having at least one conductive via, establishing the electric component on the base, the electric component having at least one port electrically coupled to the at least one via, forming a lid, and attaching the lid to the base, the lid and the base defining a sealed cavity therebetween for accommodating the electric component.

DETAILED DESCRIPTION OF THE INVENTION

Figure 1A:
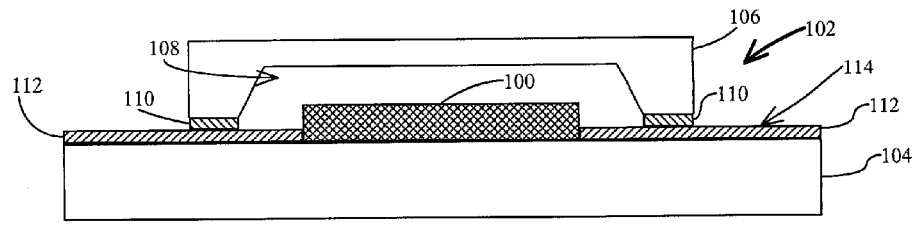
FIG. 1A is a cross-sectional side view of a prior art ceramic electric component package.
Figure 1B:
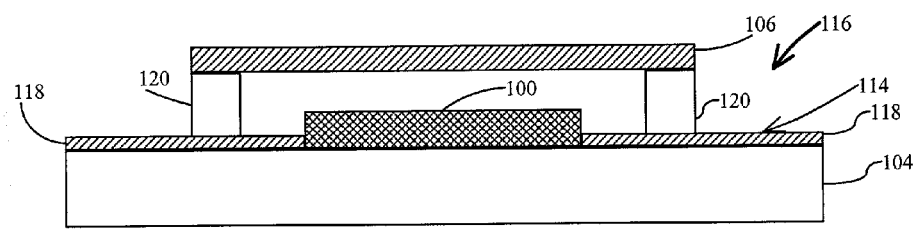
FIG. 1B is a cross-sectional side view of an alternative prior art ceramic electric component package.
Figure 1C:
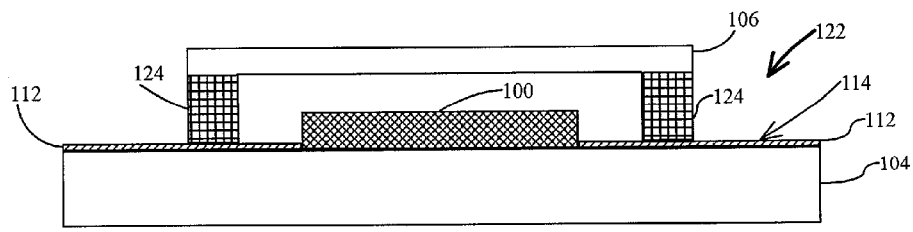
FIG. 1C is a cross-sectional side view of a prior art semiconductor component package.
Figure 2:
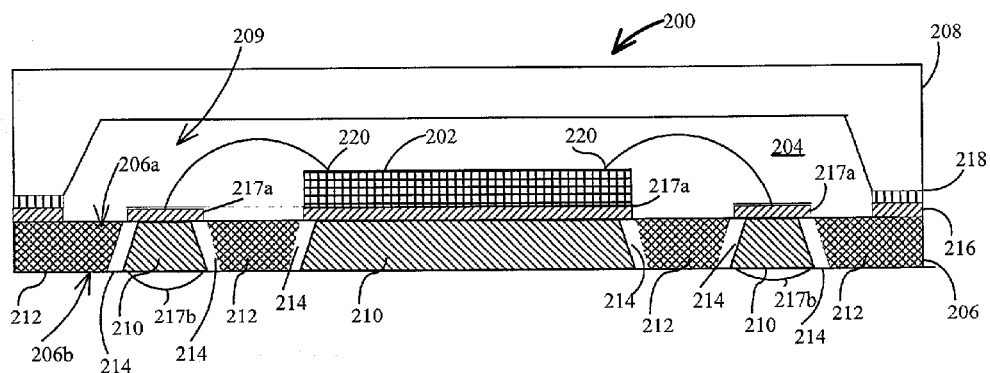
FIG. 2 is a cross-sectional side view of an electric component package in accordance with the present invention.

FIG. 2 depicts a cross-sectional side view of a package 200 in accordance with the present invention for housing an electric component 202 within a sealed cavity 204. In general overview, the package 200 includes a base 206 and a lid 208, which define the sealed cavity 204 therebetween. The base 206 has at least one via 210 extending therethrough, allowing signals associated with the electric component 202 to pass between the sealed cavity 204 and the exterior of the package 200 without passing through the junction between the base 206 and the lid 208. In a preferred embodiment, the package 200 is mass produced using wafer level processing techniques and then singulated (i.e., separated from adjacent packages) using conventional dicing techniques. The present invention is particularly useful, although not exclusively so, for hermetically sealing environmentally sensitive high frequency electric components, such as semiconductor lasers, and micro electromechanical systems (MEMS).

The base 206 provides a mounting surface on which the electric component 202 can be mounted and vias 210 extending through the base 206 for passing signals associated with the component 202 such as control, I/O, and/or power signals. In addition, the vias 210 may be used for heat transfer. The vias 210 extend between a top surface 206a of the base 206 and a bottom surface 206b of the base 206, and are electrically isolated from one another by a dielectric material 212 having a coefficient of thermal expansion that is approximately equal to that of the vias 210. In a preferred embodiment, the vias 210 are a conventional semiconductor material such as silicon and the dielectric material 212 is glass (e.g., borosilicate glass).

To improve conductivity, the semiconductor material of the vias 210 may be heavily doped and/or the vias 210 may further include a metal sheath 214 (e.g., silver) surrounding the semiconductor material. Vias 210 surrounded by a metal sheath 214 are especially conductive at high frequencies such as radio frequencies (rf) or microwave frequencies. In an alternative embodiment, the vias 210 may be comprised entirely of metal.

In the illustrated embodiment, the base 206 further includes a seal ring 216 for use in attaching the lid 208 to the base 206, cavity bonding pads 217a for use in establishing the electric component 202 on the base 206 and electrically connecting the component 202 to the vias 210, and external bonding pads 217b for facilitating electrical continuity through the vias 210. The seal ring 216 is preferably one or more layers of metal that form a pattern on the base 206 that surrounds the footprint of the electric component 202 and the vias 210 to which the component 202 is coupled. The one or more layers of metal that form the seal ring 216 may include a layer of Nichrome and a layer of platinum. The bonding pads 217a, b are preferably one or more layers of metal deposited on the exposed surfaces of the via 210. The one or more layers of metal that form the cavity bonding pads 217a may include sequential layers of titanium/platinum/gold or titanium/platinum/copper. The one or more layers of metal that form the external bonding pads 217b may include sequential layers of titanium/tungsten, copper, and solder (e.g., tin/lead solder). Other suitable metal layers for forming the seal ring 216 and bonding pads 217a, b will be apparent to those skilled in the art of integrated circuits.

The lid 208 is attached to the base 206 to create the sealed cavity 204, which, preferably, is hermetically sealed. The lid 208 has a coefficient of thermal expansion that is approximately equal to that of the base 206 and, preferably, is silicon. In the illustrated embodiment, the lid 208 includes a cavity 209 that is sized to accommodate the component 202. In addition, the lid 208 includes a seal ring 218, which is a mirror image of the base seal ring 216. Preferably, the lid seal ring 218 includes one or more layers of metal, which may include a layer of Nichrome, a layer of platinum, and a layer of solder, such as gold/tin (Au/Sn) solder, for use in bonding the lid seal ring 218 to the base seal ring 216.

The component 202 is one or more electric components to be sealed within the sealed cavity 204 created by attaching the lid 208 to the base 206. The component 202 has one or more ports 220, such as power, control, and/or I/O signal ports, that are connected to the vias 210 that extend through the base 206. The component 202 may be a discrete component such as a resistor or capacitor, an integrated circuit with leads that can be wire-bound to the cavity bonding pads 217a deposited on the vias 210, an integrated circuit with a ball grid array (BGA) for solder ball attachment to the cavity bonding pads 217a, a MEMS, or essentially any electric component.

Figure 3A:
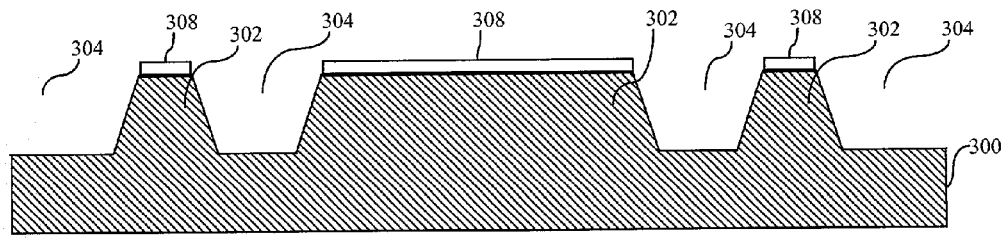
FIGS. 3A–H are cross-sectional side views depicting the formation of a base, the establishment of an electric component on the base, and the attachment of a lid to the base to create the electric component package of FIG. 2.
Figure 3B:
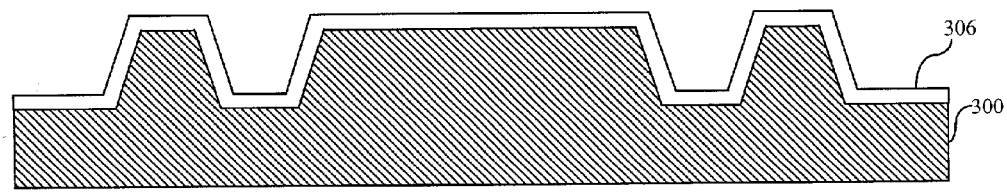
Figure 3C:
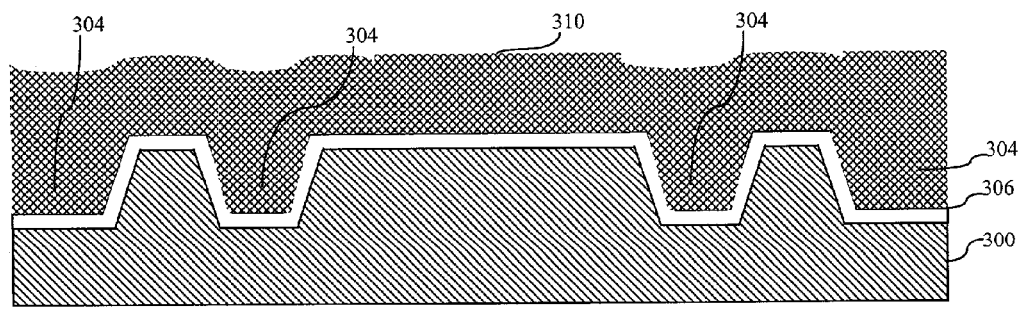
Figure 3D:
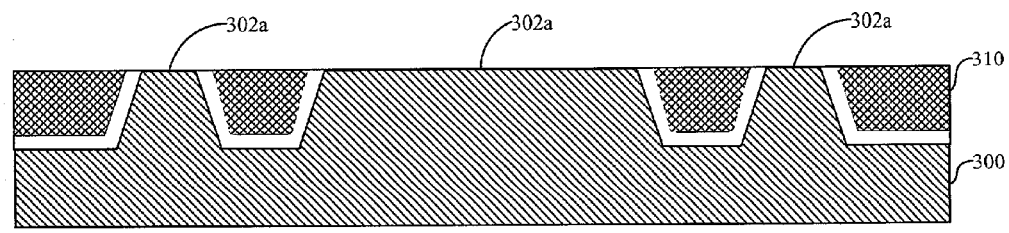
Figure 3E:
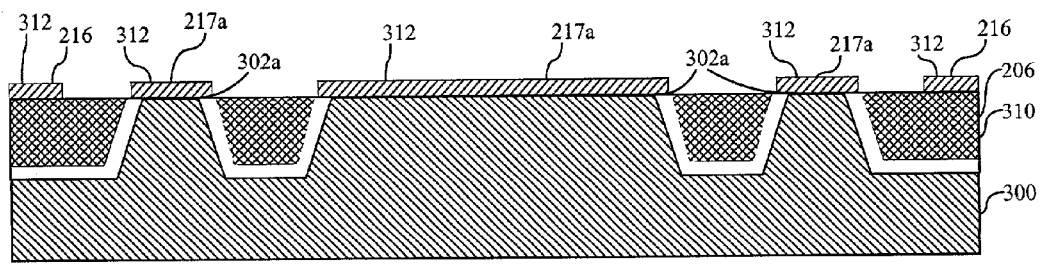
Figure 3F:
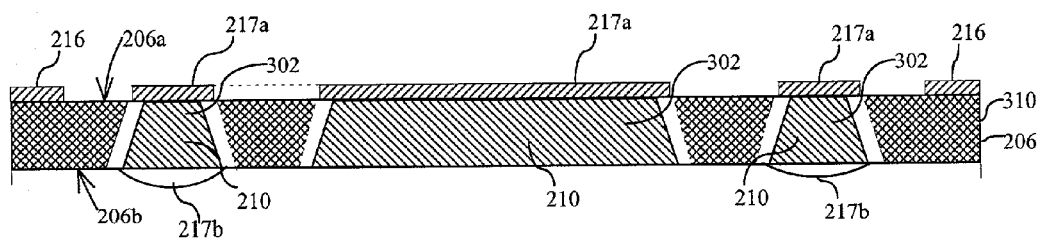
Figure 3G:
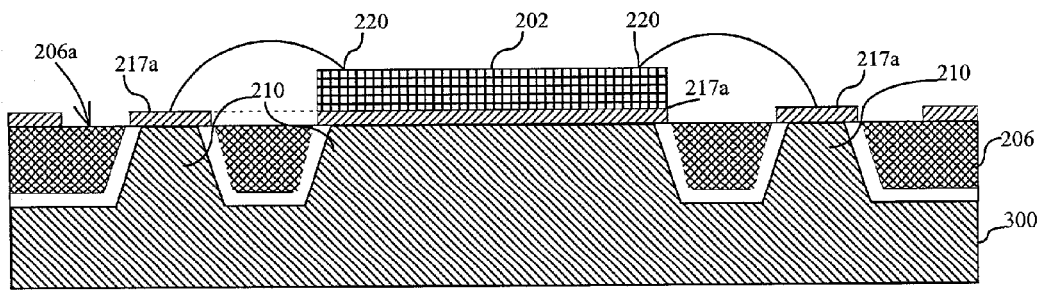
Figure 3H:
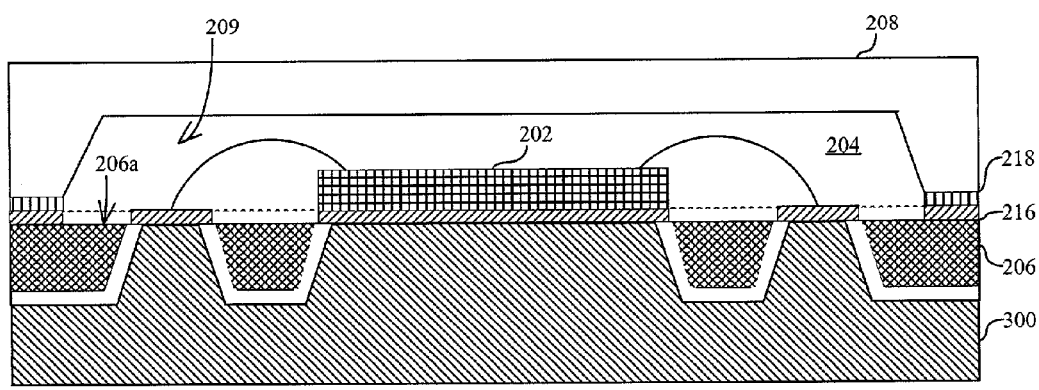

FIGS. 3A–H are a series of diagrams illustrating a preferred method for producing the electric component package 200 illustrated in FIG. 2 with like elements having like numbers. In general overview, with reference to FIG. 2, the method includes (a) forming a base 206 having a first surface 206a and a second surface 206b opposite the first surface 206a, the base 206 including at least one conductive via 210 extending between the first and second surfaces 206a, b (FIGS. 3A–F); (b) attaching a component 202 having at least one port to the first surface 206a of the base 206, the port coupled to a via 210 (FIG. 3G); and (c) creating a lid 208 and coupling the lid 208 to the first surface 206a of the base 206, the lid 208 and base 206 defining a sealed cavity 204 therebetween for accommodating the component 202 (FIG. 3H). In a preferred embodiment, the steps are performed at the wafer level using conventional silicon wafer integrated circuit manufacturing machinery and techniques.

With particular reference to FIGS. 3A–F, the general step of forming a base 206 (FIG. 2) will now be described. As shown in FIG. 3A, a planar conductive material (e.g., silicon) is etched to produce an etched conductive layer 300 including pedestals 302 and valleys 304. As will be described below, the pedestals 302 will form the vias 210 that extend through the base 206 depicted in FIG. 2. Preferably, the valleys 304 are at least 6 mils deep (i.e., the pedestals 302 are at least 6 mils high).

The etched conductive layer 300 is produced by forming a mask 308 on a planar conductive material. The valleys 304 are formed in areas of the planar conductive material that are not shielded by the mask 308; and define the pedestals 302, which are in areas shielded by the mask 308. In a preferred embodiment, the mask 308 is a silicon nitride material produced on the planar conductive material in a known manner and the planar conductive material is etched using a known KOH and water solution. Alternatively, the conductive material may be etched using a known dry etch process. Other suitable etching techniques will be readily apparent to those skilled in the art. After the conductive material is etched, the mask 308 may be removed in one of several well known manners.

As shown in FIG. 3B, a metal layer 306 is optionally deposited on the etched surface of the etched conductive layer 300. As will be described below, the metal layer 306 will form the metal sheath 214 surrounding the vias 210 depicted in FIG. 2. The metal layer 306 is deposited on the etched surface using conventional techniques. For example, silver may be deposited on the etched surface by evaporating or sputtering a titanium/tungsten layer followed by a silver layer using known techniques. The titanium/tungsten layer acts as an adhesion layer to aid in adhering the silver layer to the surface of the etched conductive layer 300.

As shown in FIG. 3C, a dielectric material 310 is deposited on the etched conductive layer 300 to fill in the valleys 304. In a preferred embodiment, the dielectric material 310 is glass, which is applied to the underlying layer (i.e., the etched conductive layer or, if present, the metal layer 304). The glass is fused to the underlying layer through an encapsulation process such as described in commonly assigned U.S. Pat. Nos. 5,268,310 and 5,343,070 to Goodrich et al., incorporated fully herein by reference.

As shown in FIG. 3D, the dielectric material 310 is ground to expose the top surfaces 302a of the pedestals 302. In a preferred embodiment, the dielectric material 210 is ground and polished using known techniques to produce a planar specular surface having islands of exposed pedestals 302 separated by dielectric material 310.

As shown in FIG. 3E, structures 312 are formed on the ground surface of the dielectric material 310 and the top surfaces 302a of the exposed pedestals 302. In the illustrated embodiment, the structures 312 include a seal ring 216 deposited on the dielectric material 310 and cavity bonding pads 217a deposited on the top surface 302a of the exposed pedestals 302. In addition, the structures 312 may include by way of example, but is not limited to, fabricated monolithic and heterolithic components (e.g., P-I-N diodes, Schottky diodes, varactor diodes, and resistors) and metal connections between the top surfaces 302a of the exposed pedestals 302. Methods for fabricating heterolithic integrated circuits can be found in commonly assigned U.S. Pat. No. 6,150,197 to Boles et al., incorporated fully herein by reference.

In a preferred embodiment, the seal ring 216 is formed on the ground dielectric material 310 using a conventional dome evaporator to deposit sequentially a layer of Nichrome and a layer of platinum. In addition, preferably, the cavity bonding pads 217a are formed on the top surfaces 302a of the exposed pedestals 302 by depositing sequentially titanium/platinum/gold or titanium/platinum/copper metal layers for use in bonding the component 202 and its associated ports 220 to the base 206.

As shown in FIG. 3F, the etched conductor layer is ground on a second surface 206b opposite the first surface 206a to expose the dielectric material 310, thereby electrically isolating the pedestals 302 from one another to form the vias 210. In addition, in the illustrated embodiment, the external bonding pads 217b are attached to the individual vias 210. In one embodiment, the final thickness of the base 206 after grinding is approximately 5 mils. Preferably, the external bonding pads 217b are conventional solder bumps created in a known manner by depositing sequentially an adhesion layer (e.g., a layer of titanium/tungsten and a layer of copper) and a solder bump.

With particular reference to FIG. 3G, the general step of establishing a component 202 on a base 206 (FIG. 2) will now be described. As shown in FIG. 3G, the component 202 is established on the base 206 after the dielectric material 310 is ground and structure 312 is formed on the ground surface (as shown in FIGS. 3D–E) and prior to the etched conductive layer 300 being ground and polished (as shown in FIG. 3F). For example, the component 202 may be established on the base 206 immediately following or substantially simultaneously with the step of forming the structure 312 on the base 206 (FIG. 3E).

Components 202 may be established on the base 206 by bonding discrete components or integrated circuits to the base 206, depositing various metal layers to form components on the base, and/or epitaxially growing components on the base 206. For example, in the embodiment illustrated in FIG. 3G, the component 202 is established on the base by bonding the component 202 to the base 206 and wire bonding the ports 220 associated with the component 202 to the vias 210. Other methods for establishing components 202 on the base 206 will be readily apparent to those skilled in the art.

With particular reference to FIG. 3H, the general step of creating a lid 208 and attaching the lid 208 to the base 206 will now be described. In the illustrated embodiment, the lid 208 is coupled to the base 206 after the component 202 is established on the base 206 (as shown in FIG. 3G) and prior to the etched conductive layer 300 being ground and polished (as shown in FIG. 3F). As shown in FIG. 3H, the lid 208 includes preferably a cavity 209 for accommodating the component 202 and a seal ring 218 for attaching the lid 208 to the base 206.

In a preferred embodiment, the lid 208 is created by depositing the lid seal ring 218 on a wafer (e.g., a silicon wafer) and etching the wafer to form the cavity 209. The lid seal ring 218 forms a mask on the wafer for use in etching the wafer to create the cavity 209. The wafer is then etched using conventional techniques to form the cavity 209.

The lid seal ring 218 may be formed by depositing photo resist in a desired pattern on the wafer with cutouts for the desired pattern. The desired pattern of the lid seal ring 218 is a mirror image of the pattern used to create the base seal ring 216. A dome evaporator may be used to deposit sequential layers of metal, such as a layer of Nichrome, a layer of platinum over the Nichrome layer, and then a 5 um layer of gold/tin (Au/Sn) solder having a melting point of approximately 300 degrees Celsius. Although gold/tin solder is used in the preferred embodiment, essentially any solder composition may be used, e.g., Pb/Sn, Sn/Sb, Sn/Cu/G, Au/Ge, Au/Si, etc. The photo resist is then dissolved to remove excess metal, leaving the lid seal ring 218.

The lid 208 is then attached to the base 206. In a preferred embodiment, the lid 208 is attached to the base 206 by positioning the lid 208 relative to the base 206 using known techniques such that the base seal ring 216 and the lid seal ring 218 are aligned and in contact with one another. The seal rings 216, 218 are then heated to a temperature sufficient to reflow the solder on the lid seal ring 218 and, then, cooled to join the lid 208 to the base 206, thereby creating the sealed cavity 204 therebetween.

The solder used to attached the lid 208 to the base 206 should have a higher reflow temperature than the solder used in the external bonding pads 217b on the base 206 (described in reference to FIG. 3F) to prevent the temperatures used to reflow the solder in the external bonding pads 217b from affecting the junction between the base 206 and the lid 208.

In a preferred embodiment, with reference to FIG. 2, the electric component package 200 is assembled at wafer level. Wafer level assembly is achieved by aligning and joining the wafer on which the bases 206 are fabricated with the wafer on which the lids 208 are fabricated using commercially available wafer aligner/bonders, which are presently used to make Silicon-on-Insulator (SOI) wafers and micro electro mechanical (MEM) gas turbines, for example. The wafer aligner/bonder aligns the base 206 and lid 208 using alignment patterns on their respective surfaces. The base and lid are then held in alignment and moved into a bonding chamber. The base 206 and lid 208 are clamped together within the bonding chamber and the temperature is increased to reflow the solder on the lid ring seal 218. Preferably, the temperature required to reflow the solder is below about 350° C. The joined base 206 and lid 208 are then cooled to form the electric component package 200. The electric component package 200 is then transferred to an output cassette for singulation using known dicing techniques to separate the package 200 from adjacent devices. In a preferred embodiment, the type of gas and the pressure of the gas in the bonding chamber can be controlled in a known manner, thus allowing the type of gas and the pressure within the sealed cavity 208 of the electric component package 200 to be controlled.

Having thus described a few particular embodiments of the invention, various alterations, modifications, and improvements will readily occur to those skilled in the art. For example, it will be recognized by those of skill in the art that although the sealed cavity has been described as being defined by a lid having a cavity attached to a base, the base may be etched (rather than the lid) to form a cavity to define the sealed cavity when attached to the lid, or both the base and the lid may each contain a cavity that, together, define the sealed cavity. Such alterations, modifications and improvements as are made obvious by this disclosure are intended to be part of this description though not expressly stated herein, and are intended to be within the spirit and scope of the invention. Accordingly, the foregoing description is by way of example only, and not limiting. The invention is limited only as defined in the following claims and equivalents thereto.

What is claimed is:

1. A process for fabricating an electric component package having a sealed cavity for accommodating an electric component, comprising the steps of:
    etching a semiconductor base layer having first and second opposing surfaces to form at least one pedestal on said first surface;
    applying a layer of dielectric material to said first surface of said etched semiconductor base layer;
    grinding said dielectric layer to expose a surface of said at least one pedestal;
    establishing an electric component on said ground dielectric layer, said electric component having at least one port coupled to said exposed surface of said at least one pedestal;
    attaching a lid to said ground dielectric layer, said lid having a cavity for accommodating said electric component; and
    grinding said semiconductor base layer on said second surface to expose said dielectric layer, said at least one pedestal forming a conductive via extending through said dielectric layer.

2. The method of claim 1, wherein all steps are performed at wafer level.

3. The method of claim 1, wherein said base and said lid have approximately equal coefficients of thermal expansion.

4. The method of claim 1, wherein said component is hermetically sealed within said cavity between said base and said lid when said lid is attached to said base.

5. The process of claim 1, further comprising:
    depositing a base seal ring on said ground dielectric layer, said base seal ring surrounding a footprint of said electric component and said via.

6. The process of claim 1, further comprising the step of fabricating said lid by etching a semiconductor lid layer.

7. The process of claim 6, wherein said lid fabrication step comprises at least the steps of:
    depositing a lid seal ring on a first surface of said semiconductor lid layer, said lid seal ring coupled to said base seal ring in said attaching step; and
    etching said first surface of said semiconductor lid layer to form said cavity using said lid seal ring as an etch mask.

8. The process of claim 1, further comprising the step of forming a solder bump on said second surface, said solder bump coupled to said at least one electrically isolated pedestal.

9. The process of claim 1, said establishing step comprising at least the step of:
    building said component on said ground dielectric layer.

10. The process of claim 1, said establishing step comprising at least the step of:
    placing said component on said ground dielectric layer.

11. The process of claim 10, wherein said placing step comprises:
    attaching said component to said ground dielectric layer; and
    electrically coupling said at least one port to said exposed surface of said at least one pedestal.

12. The process of claim 11, wherein said coupling step comprises at least the step of:
    wirebonding said at least one port to said exposed surface of said at least one pedestal.

13. The process of claim 11, wherein said coupling step comprises at least the step of:

attaching said at least one port to said exposed surface of said at least one pedestal with a solder ball.

14. The process of claim 1, wherein said applying step comprises at least the step of:

fusing said layer of dielectric material to said first surface of said etched semiconductor base layer.

15. The process of claim 1, further comprising the step of:

applying at least one layer of metal said first surface of said etched semiconductor base layer prior to applying said layer of dielectric material.

* * * * *